United States Patent
Chen et al.

(10) Patent No.: US 11,011,251 B1
(45) Date of Patent: May 18, 2021

(54) SYSTEM AND METHOD OF VERIFYING HARD POST PACKAGE REPAIR AND NON-TRANSITORY COMPUTER READABLE MEDIUM

(71) Applicant: NANYA TECHNOLOGY CORPORATION, New Taipei (TW)

(72) Inventors: Jyun-Da Chen, Taoyuan (TW); Nung Yen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/988,736

(22) Filed: Aug. 10, 2020

(51) Int. Cl.
  *G11C 29/44* (2006.01)
  *G11C 29/10* (2006.01)
  *G11C 29/12* (2006.01)
  *G11C 29/00* (2006.01)

(52) U.S. Cl.
  CPC .............. *G11C 29/44* (2013.01); *G11C 29/10* (2013.01); *G11C 29/12015* (2013.01); *G11C 29/76* (2013.01); *G11C 2029/4402* (2013.01)

(58) Field of Classification Search
  CPC ... G11C 29/44; G11C 29/10; G11C 29/12015; G11C 29/76; G11C 2029/4402
  See application file for complete search history.

(56) References Cited

U.S. PATENT DOCUMENTS

2004/0221210 A1* 11/2004 Hoffmann ............... G11C 29/24
                                                            714/719
2020/0058365 A1* 2/2020 Kim ........................ G11C 29/70

* cited by examiner

*Primary Examiner* — Han Yang
(74) *Attorney, Agent, or Firm* — CKC & Partners Co., LLC

(57) ABSTRACT

A method of verifying a hard post package repair (hPPR) includes steps as follows. A predetermined data background is written into a partial array of a volatile memory. First data are read out from a target row of the partial array of the volatile memory. The volatile memory is commanded to perform the hPPR on the target row. The predetermined data background is written into the partial array of the volatile memory anew after the hPPR has been performed. Second data are read out from a target row of the partial array of the volatile memory. The first data are compared with the second data to verify whether the hPPR fails.

20 Claims, 3 Drawing Sheets

SYSTEM AND METHOD OF VERIFYING HARD POST PACKAGE REPAIR AND NON-TRANSITORY COMPUTER READABLE MEDIUM

BACKGROUND

Field of Invention

The present invention relates to systems and methods, and more particularly, systems and methods of verifying a hard post package repair (hPPR).

Description of Related Art

A memory device includes a lot of memory cells. Traditionally, if one of the memory cells was the failure, the memory device would be eliminated.

Nowadays, venders support a function of hPPR to let the customer repair failure row. It is an effective way to increase production reliability. However, the question is how the customer knows the hPPR repairs the failure row actually and how the venders know their hPPR is working.

SUMMARY

An embodiment of the present disclosure is related to a system of verifying a hard post package repair (hPPR), and the system includes a connection device, a storage device and a processor. The connection device is configured to connect a volatile memory. The storage device is configured to store at least one instruction. The processor is electrically connected to the storage device and is configured to access and execute the at least one instruction for: writing a predetermined data background into a partial array of the volatile memory; reading out first data from a target row of the partial array of the volatile memory; commanding the volatile memory to perform the hPPR on the target row; writing the predetermined data background into the partial array anew after the hPPR has been performed; reading out second data from the target row of the partial array; comparing the first data with the second data to verify whether the hPPR fails.

Another embodiment of the present disclosure is related to a method of verifying a hPPR, and the method includes steps as follows. A predetermined data background is written into a partial array of a volatile memory. First data are read out from a target row of the partial array of the volatile memory. The volatile memory is commanded to perform the hPPR on the target row. The predetermined data background is written into the partial array of the volatile memory anew after the hPPR has been performed. Second data are read out from a target row of the partial array of the volatile memory. The first data are compared with the second data to verify whether the hPPR fails.

Yet another embodiment of the present disclosure is related to a non-transitory computer readable medium to store a plurality of instructions for commanding a computer to execute a method of verifying a hPPR, and the method includes steps as follows. A predetermined data background is written into a partial array of a volatile memory. First data are read out from a target row of the partial array of the volatile memory. The volatile memory is commanded to perform the hPPR on the target row. The predetermined data background is written into the partial array of the volatile memory anew after the hPPR has been performed. Second data are read out from a target row of the partial array of the volatile memory. The first data are compared with the second data to verify whether the hPPR fails.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
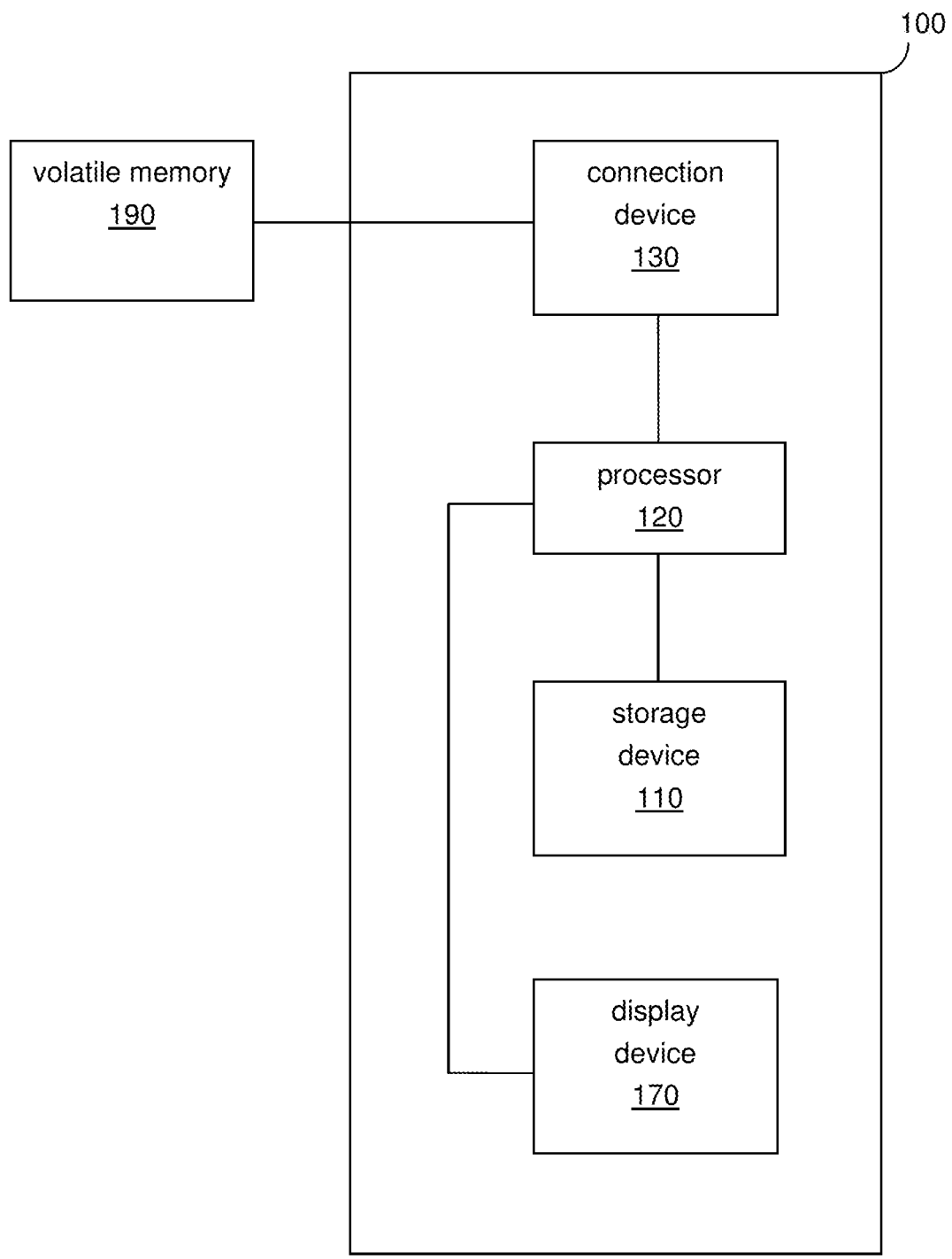
FIG. 1 is a block diagram of a system of verifying a hard post package repair (hPPR) according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a system 100 of verifying a hard post package repair (hPPR) according to some embodiments of the present disclosure. As shown in FIG. 1, the system 100 includes a storage device 110, a processor 120, a connection device 130 and a display device 170. For example, the system 100 may be a computer or the like, in which the storage device 110 may be storage hardware, such as a hard disk drive (HDD) or a solid-state drive (SSD), the processor 120 may be a central processing unit (CPU), the connection device 130 may be a connector, a connection circuit or the like, and the display device 170 may be a LCD or the like.

In structure, the processor 120 is electrically connected to the storage device 110, the connection device 130 and the display device 170. The connection device 130 can be connected to a volatile memory 190 detachably. For example, the volatile memory is a dynamic random access memory (e.g., a double data rate synchronous dynamic random access memory) or the like.

In use, the connection device 130 is configured to connect the volatile memory 190. The storage device 110 is configured to store at least one instruction. The processor 120 is configured to access and execute the instruction for writing a predetermined data background into a partial array of the volatile memory 190, and then reading out first data from a target row of the partial array of the volatile memory 190. The storage device 110 can store the first data.

Then, the processor 120 is configured to access and execute the instruction for commanding the volatile memory 190 to perform the hPPR on the target row. When the hPPR fails, the target row is the same as before; therefore the inherently electrical characteristics of the target row are not changed. On the contrary, when the hPPR succeeds, the original target row is physically repaired as a repaired target row, or the original target row is changed with a substitute as the repaired target row; therefore, the inherently electrical characteristics of the original target row are different from the inherently electrical characteristics of the repaired target row.

After the hPPR has been performed, the processor 120 is configured to access and execute the instruction for writing the predetermined data background into the partial array of the volatile memory 190 anew, and then reading out second data from the target row of the partial array of the volatile memory 190. The storage device 110 can store the second data.

Then, the processor 120 is configured to access and execute the instruction for comparing the first data with the second data to verify whether the hPPR fails. The display device 170 can displays the comparison result that indicates the hPPR fails or succeeds.

In some embodiments, the processor 120 is configured to access and execute the instruction for determining that the hPPR fails when the first data are equal to the second data. Alternatively, in some embodiments, the processor 120 is configured to access and execute the instruction for determining that the hPPR succeeds when the first data are different from the second data.

Figure 2:
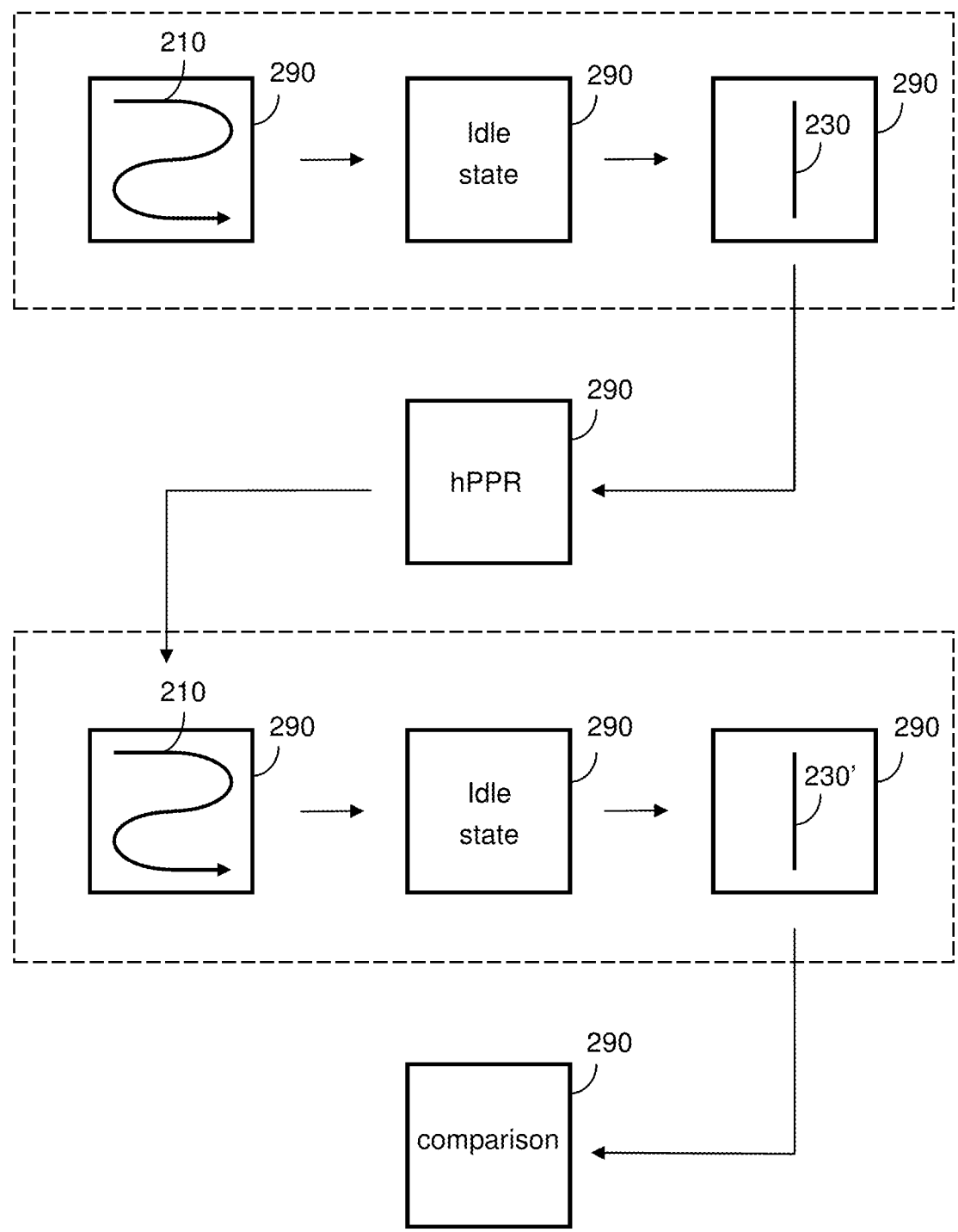
FIG. 2 is a schematic diagram of operations of the system according to some embodiments of the present disclosure.

For a more complete understanding of operations of the system 100, referring FIGS. 1-2, FIG. 2 is a schematic diagram of operations of the system 100 according to some embodiments of the present disclosure. In some embodiments, the volatile memory 190 has a partial array 290.

Firstly, the processor 120 is configured to access and execute the instruction for writing the predetermined data background 210 into the partial array 290 of the volatile memory 190. In some embodiments, the predetermined data background 210 let all memory cells of each row of the partial array 290 have the same original data. In some embodiments, the predetermined data background 210 is written in the partial array 290 rather than a whole array of the volatile memory 190, thereby saving time.

Then, the processor 120 is configured to access and execute the instruction for waiting a predetermined idle period, and therefore the partial array 290 is in an idle state. In practice, the storage capacities of the memory cells of the partial array 290 cannot perfectly identical to each other, and therefore the respective row of the partial array 290 has its inherently electrical characteristics. Accordingly, in the idle state, the stored data in the memory cells of the partial array 290 are variously and incompletely lost.

When the waiting period of time is much longer than the predetermined idle period, all stored data in the memory cells of the partial array 290 are completely lost. When the waiting period of time is much shorter than the predetermined idle period, no stored data in the partial array 290 can be lost. In some embodiments, the predetermined idle period can be about one minute.

Accordingly, once the predetermined idle period is finished, the processor 120 is configured to access and execute the instruction for immediately reading out the first data from the target row 230 corresponding to an assigned address. In some embodiments, the target row 230 is one of rows of the partial array 290, and the processor 120 is configured to access and execute the instruction for assigning the assigned address that indicates the target row 230.

Then, the processor 120 is configured to access and execute the instruction for commanding the volatile memory 190 to perform the hPPR on the target row 230.

After the hPPR has been performed, the processor 120 is configured to access and execute the instruction for writing the predetermined data background 210 into the partial array 290 anew.

Then, the processor 120 is configured to access and execute the instruction for waiting the predetermined idle period, and therefore the partial array 290 is in the idle state. Once the predetermined idle period is finished, the processor 120 is configured to access and execute the instruction for immediately reading out the second data from the target row 230' corresponding to above assigned address. It should be noted that the target row 230 at the assigned address corresponds to the target row 230'.

Specifically, when the hPPR fails, the target row 230 is Identical to the target row 230', and therefore the incompletely lost data of the target row 230 in the idle state are equal to the incompletely lost data of the target row 230' in the idle state. Accordingly, the processor 120 is configured to access and execute the instruction for determining that the hPPR fails when the first data are equal to the second data.

On the contrary, when the hPPR succeeds, the target row 230 is physically repaired as the target row 230', or the target row 230 is changed with a substitute as the target row 230'. Therefore, the incompletely lost data of the target row 230 in the idle state are different from the incompletely lost data of the target row 230' in the idle state. Accordingly, the processor 120 is configured to access and execute the instruction for determining that the hPPR succeeds when the first data are different from the second data.

Figure 3:
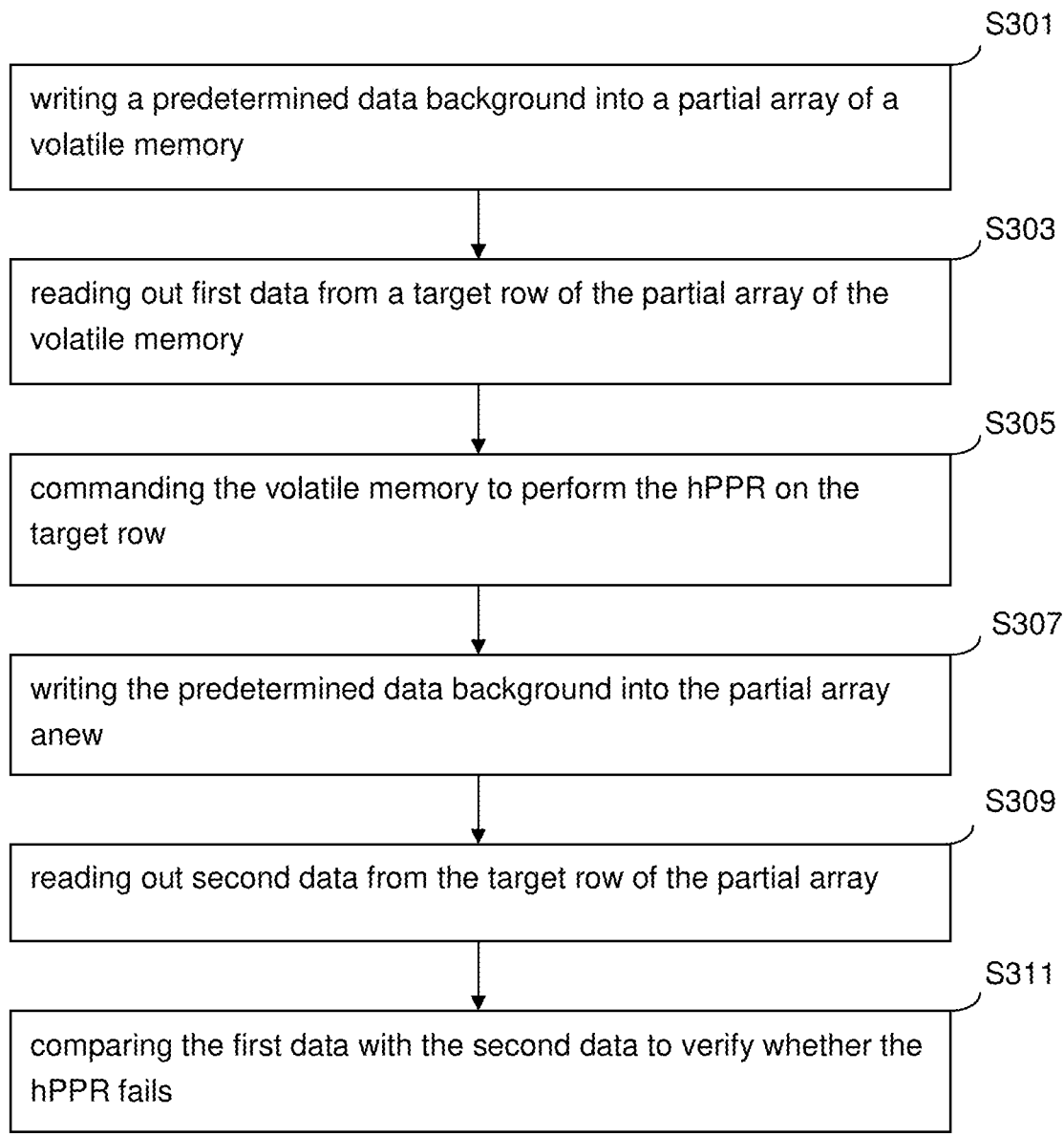
FIG. 3 is a flow chart of a method of verifying the hPPR according to some embodiments of the present disclosure.

For a more complete understanding of a method performed by the system 100, referring FIGS. 1-3, FIG. 3 is a flow chart of the method 300 of verifying the hPPR according to an embodiment of the present disclosure. As shown in FIG. 3, the method 300 includes operations S301, S303, S305, S307, S309 and S311. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The method 300 may take the form of a computer program product on a computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives.

In operation S301, the predetermined data background 210 is written into the partial array 290 of the volatile memory 190. Then, in operation S303, the first data are read out from the target row 230 of the partial array 290 of the volatile memory 190. In operation S305, the volatile memory 190 is commanded to perform the hPPR on the target row 230. In operation S307, the predetermined data background is written into the partial array 290 of the volatile memory 190 anew after the hPPR has been performed. Then, in operation S309, the second data are read out from the target row 230' of the partial array 290 of the volatile memory 190. In operation S311, the first data are compared with the second data to verify whether the hPPR fails.

In some embodiments, it is determined that the hPPR fails when the first data are equal to the second data. Alternatively, it is determined that the hPPR succeeds when the first data are different from the second data.

In some embodiments, before operation S305 and after operation S301, in operation S303, the predetermined idle period (e.g., one minute) is waited, and therefore the partial array 290 is in the idle state; once the predetermined idle period is finished, the first data are immediately read out from the target row 230.

In some embodiments, after operation S307, in operation S309, the predetermined idle period is waited, and therefore the partial array 290 is in the idle state; once the predetermined idle period is finished, the second data are immediately read out from the target row 230.

In view of the above, the system 100 and the method 300 can quickly and effectively verify the hPPR.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A system of verifying a hard post package repair (hPPR), and the system comprising:
   a connection device configured to connect a volatile memory;
   a storage device configured to store at least one instruction; and
   a processor electrically connected to the storage device and configured to access and execute the at least one instruction for:
   writing a predetermined data background into a partial array of the volatile memory;
   reading out first data from a target row of the partial array of the volatile memory;
   commanding the volatile memory to perform the hPPR on the target row;
   writing the predetermined data background into the partial array anew after the hPPR has been performed;
   reading out second data from the target row of the partial array;
   comparing the first data with the second data to verify whether the hPPR fails.

2. The system of claim 1, wherein the processor accesses and executes the at least one instruction for:
   determining that the hPPR fails when the first data are equal to the second data.

3. The system of claim 1, wherein the processor accesses and executes the at least one instruction for:
   determining that the hPPR succeeds when the first data are different from the second data.

4. The system of claim 1, wherein the processor accesses and executes the at least one instruction for:
   before the hPPR is performed and after the predetermined data background has been written into the partial array, waiting a predetermined idle period; and
   once the predetermined idle period is finished, immediately reading out the first data.

5. The system of claim 4, wherein the processor accesses and executes the at least one instruction for:
   after the hPPR has been performed and then after the predetermined data background has been written into the partial array anew, waiting the predetermined idle period; and
   once the predetermined idle period is finished, immediately reading out the second data.

6. The system of claim 4, wherein the predetermined idle period is one minute.

7. The system of claim 1, wherein the volatile memory is a dynamic random access memory.

8. A method of verifying a hPPR, and the method comprising steps of:
   writing a predetermined data background into a partial array of a volatile memory;
   reading out first data from a target row of the partial array of the volatile memory;
   commanding the volatile memory to perform the hPPR on the target row;
   writing the predetermined data background into the partial array anew after the hPPR has been performed;
   reading out second data from the target row of the partial array;
   comparing the first data with the second data to verify whether the hPPR fails.

9. The method of claim 8, further comprising:
   determining that the hPPR fails when the first data are equal to the second data.

10. The method of claim 8, further comprising:
    determining that the hPPR succeeds when the first data are different from the second data.

11. The method of claim 8, wherein the step of reading out the first data comprises:
    before the hPPR is performed and after the predetermined data background has been written into the partial array, waiting a predetermined idle period; and
    once the predetermined idle period is finished, immediately reading out the first data.

12. The method of claim 11, wherein the step of reading out the second data comprises:
    after the hPPR has been performed and then after the predetermined data background has been written into the partial array anew, waiting the predetermined idle period; and once the predetermined idle period is finished, immediately reading out the second data.

13. The method of claim 11, wherein the predetermined idle period is one minute.

14. The method of claim 8, wherein the volatile memory is a dynamic random access memory.

15. A non-transitory computer readable medium to store a plurality of instructions for commanding a computer to execute a method of verifying a hPPR, and the method comprising steps of:
    writing a predetermined data background into a partial array of a volatile memory;
    reading out first data from a target row of the partial array of the volatile memory;
    commanding the volatile memory to perform the hPPR on the target row;
    writing the predetermined data background into the partial array anew after the hPPR has been performed;
    reading out second data from the target row of the partial array;
    comparing the first data with the second data to verify whether the hPPR fails.

16. The non-transitory computer readable medium of claim 15, wherein the method further comprises:
    determining that the hPPR fails when the first data are equal to the second data.

17. The non-transitory computer readable medium of claim 15, wherein the method further comprises:
    determining that the hPPR succeeds when the first data are different from the second data.

18. The non-transitory computer readable medium of claim 15, wherein the step of reading out the first data comprises:
    before the hPPR is performed and after the predetermined data background has been written into the partial array, waiting a predetermined idle period; and
    once the predetermined idle period is finished, immediately reading out the first data.

19. The non-transitory computer readable medium of claim 18, wherein the step of reading out the second data comprises:
    after the predetermined data background has been written into the partial array anew, waiting the predetermined idle period again; and
    once the predetermined idle period is finished, immediately reading out the second data.

20. The non-transitory computer readable medium of claim 18, wherein the predetermined idle period is one minute.

* * * * *